United States Patent [19]

Imabayashi et al.

[11] Patent Number: 5,376,858
[45] Date of Patent: Dec. 27, 1994

[54] ULTRASONIC MOTOR

[75] Inventors: Hiroyuki Imabayashi, Sagamihara; Tomoki Funakubo, Hachioji, both of Japan

[73] Assignee: Olympus Optical Co., Ltd., Tokyo, Japan

[21] Appl. No.: 125,914

[22] Filed: Sep. 23, 1993

[30] Foreign Application Priority Data

Sep. 25, 1992 [JP] Japan .................. 4-256802
Oct. 28, 1992 [JP] Japan .................. 4-290521

[51] Int. Cl.$^5$ .................. H01L 41/08; H02N 2/00
[52] U.S. Cl. .................. 310/333; 310/323; 310/325
[58] Field of Search .................. 310/323, 325, 333, 359; 318/116

[56] References Cited

U.S. PATENT DOCUMENTS

| | | | |
|---|---|---|---|
| 3,506,858 | 4/1970 | Shaw | 310/333 |
| 3,584,243 | 6/1971 | Fabian | 310/333 |
| 3,614,488 | 10/1971 | Sonderegger et al. | 310/338 |
| 4,019,073 | 4/1977 | Vishnevsky et al. | 310/323 |
| 4,523,120 | 6/1985 | Assard et al. | 310/323 |
| 4,983,874 | 1/1991 | Yamaguchi | 310/323 |
| 5,027,028 | 6/1991 | Skipper | 310/323 |
| 5,032,754 | 7/1991 | Iwao et al. | 310/323 |
| 5,107,162 | 4/1992 | Yamaguchi | 310/323 |
| 5,159,226 | 10/1992 | Montgomery | 310/333 |

FOREIGN PATENT DOCUMENTS

| | | | |
|---|---|---|---|
| 0257776 | 12/1985 | Japan | 310/359 |
| 0136577 | 5/1989 | Japan | 310/323 |

Primary Examiner—Thomas M. Dougherty
Attorney, Agent, or Firm—Louis Weinstein

[57] ABSTRACT

An ultrasonic motor comprising an ultrasonic vibrator having a pair of resonators for transferring and enlarging ultrasonic vibration, an electro-mechanical energy converter arranged between the pair of resonators, for generating ultrasonic vibration by application of alternating voltage, and a fastening element for crimping and fixing the pair of resonators and the electro-mechanical energy conversion element to each other, and an element to be driven crimped to an end of at least one of the resonators and driven by elliptic vibration which is generated at the ends. The electro-mechanical energy converter element is a pair of sliding vibrators which are polarized respectively in a pair of directions which are perpendicular to an axial direction and which are shift 90° from each other.

10 Claims, 7 Drawing Sheets ced in polarizing direction, time is taken for polarizing treatment or processing, and cost increases. Further, since displacements are reversed at the boundary line in the polarizing directions, respectively, large stresses are applied respectively to the piezoelectric elements along the boundary lines. Cracking is generated. An output from the ultrasonic vibrator is reduced. Resonance frequency changes.

ULTRASONIC MOTOR

BACKGROUND OF THE INVENTION

1. Field of the Invention

The present invention relates to ultrasonic motors and, more particularly, to an ultrasonic motor rotated by the utilization of oscillation or vibration which is generated by an electric-mechanical energy conversion element.

2. Related Art And Prior Art Statement

A prior art example will be described with technical means disclosed in Japanese Patent Laid-Open No. HEI 3-289378 taken as an example.

FIG. 12 of the attached drawings is an exploded perspective view showing an example of a conventional ultrasonic piezoelectric transducer or vibrator.

As shown in FIG. 12, a pair of piezoelectric elements 203 and 204 reversed in polarizing direction each of which is divided into two with respect to a center thereof, are used as an electric-mechanical energy conversion element. These piezoelectric elements 203 and 204 are arranged such that their polarizing boundary lines shift 90° from each other. Further, a piezoelectric element 209 is the same in configuration as the piezoelectric elements 203 and 204, and a polarizing direction is also divided into two. The ultrasonic vibrator is formed such that the ultrasonic vibrator is put between the piezoelectric elements 203, 204 and 209 and electrode plates 205, 210 and 211, and a center of the vibrator is crimped or forcedly bonded and is fixed by a bolt 206 which is a fastening element. Moreover, a metallic cylinder 201 has a portion of a horn thereof at which a rotor 208 is arranged.

Voltages of sine wave type in which their phases are shifted 90° from each other are applied to the piezoelectric elements 203 and 204, respectively, whereby bending vibration is generated on the ultrasonic vibrator. Thus, the rotor 208 is rotated. A vibrating condition is judged by a voltage value and a phase difference which are generated from the piezoelectric element 209. Frequency of driving voltage is modified or changed such that a motor output is brought to an adequate condition.

Furthermore, Japanese Patent Laid-Open No. HEI 4-91668 is used to describe an another prior art example.

An ultrasonic vibrator disclosed in Japanese Patent Laid-Open No. HEI 4-91668 is arranged such that outer diameters of both ends are thick as compared with an outer diameter of a node position of a driving vibration mode. Configuration of the ultrasonic vibrator is formed in such a manner, whereby it is possible to reduce natural frequency or frequency of vibration of the normal mode as compared with an ultrasonic vibrator which is uniform in diameter. Reversely, a modal mass increases remarkably or considerably so that there can be produced large vibration amplitude. Such technical means is used whereby the arrangement is such that efficiency of the ultrasonic motor is improved, and driving is stabilized.

By the way, in the aforesaid prior art example disclosed in Japanese Patent Laid-Open No. HEI 3-289375, thickness polarization is performed in order to generate bending vibration. The piezoelectric elements each of which is divided into two such that the polarizing directions pass through the center are used for driving and for vibration detection. Such piezoelectric elements have the following problems and so on. That is, since the piezoelectric elements must be re- Moreover, the technical means in which a large diameter position is arranged at the node position of the vibration so that an attempt is made to increase or enlarge vibration amplitude, as disclosed in Japanese Patent Laid-Open No. HEI 4-91668, is means which is used very well. However, generally, it is feared or apprehended to cause large-sizing and heavy-weighting of the ultrasonic vibrator. If an outer periphery of a portion of an added mass increases with respect to an outer peripheral diameter of the piezoelectric element that is an electric-mechanical energy conversion element, the ultrasonic vibrator is large-sized radially. Meanwhile, if an attempt is made to lengthen the portion of the added mass axially, the total length or entire length of the ultrasonic vibrator is large-sized. Accordingly, in a case where the ultrasonic vibrator is used within a restricted or limited space, this causes a large problem.

OBJECTS AND SUMMARY OF THE INVENTION

It is a first object of the invention to provide a small-size ultrasonic motor which reduces cost of piezoelectric elements, which can produce high torque, and which can produce a stable characteristic.

It is a second object of the invention to provide an ultrasonic motor which is capable of sharp or sensitive vibration detection, which is low in cost, and which can produce a stable characteristic.

Briefly, according to the invention, there is provided an ultrasonic motor comprising an ultrasonic vibrator having a pair of resonators for transferring and enlarging ultrasonic vibration, an electro-mechanical energy conversion element arranged between the pair of resonators, for generating ultrasonic vibration by application of alternate voltage, and a fastening element for crimping and fixing the pair of resonators and the electric-mechanical energy conversion element to each other, and an element to be driven crimped to ends of the resonators and driven by elliptic vibration which is generated at the ends, wherein the electro-mechanical energy conversion element is a pair of sliding vibrators which are polarized respectively in a pair of directions which are perpendicular to an axial direction and which shift 90° from each other.

These as well as other objects and advantages of the present invention will become further apparent from the following detailed explanation.

DETAILED DESCRIPTION OF THE PREFERRED EMBODIMENTS

Various embodiments of the invention will hereunder be described with reference to the accompanying drawings.

Figure 1:
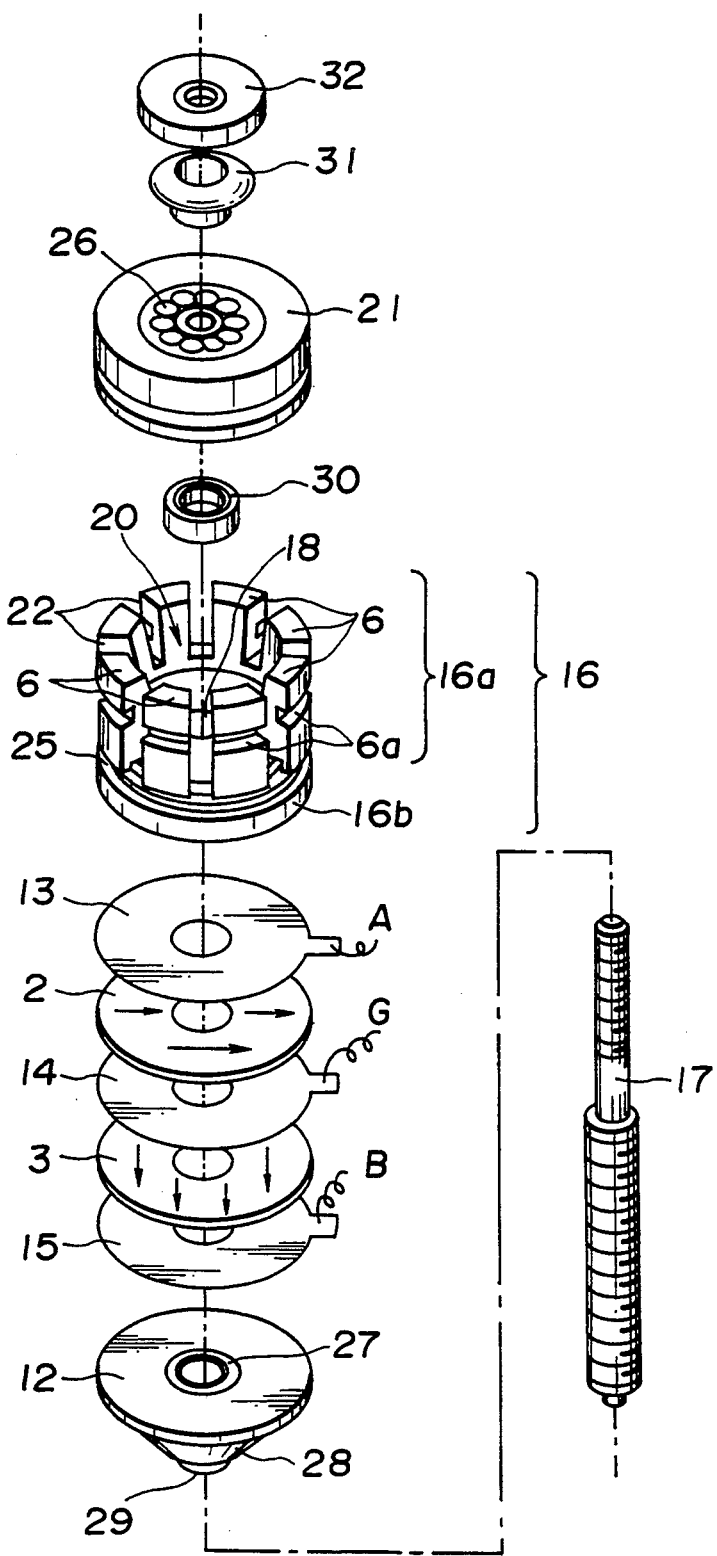
FIG. 1 is an exploded perspective view showing an arrangement of an ultrasonic motor according to a first embodiment of the invention.

FIG. 1 is an exploded perspective view showing an arrangement of an ultrasonic motor according to a first embodiment of the invention. Prior to the fact that the entire ultrasonic motor according to the first embodiment will first be described, a conceptional arrangement and function of the ultrasonic vibrator in the ultrasonic motor will be described.

Figure 7:
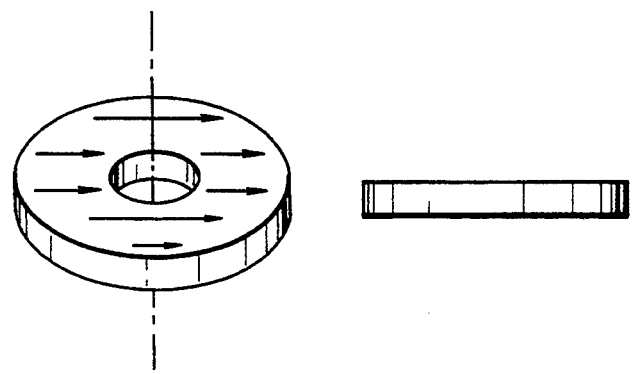
FIG. 7 is an enlarged perspective view and a side elevational view showing a polarizing direction of a sliding vibrator which is used in the third embodiment.

In the present embodiment, a sliding vibrator polarized in a slide direction in an end face is used as an electric-mechanical energy conversion element. FIG. 7 is a perspective view showing the sliding vibrator used in the present embodiment and is a side elevational view of the vibrator. A polarizing direction of the sliding vibrator is shown by an arrow.

Figure 8:
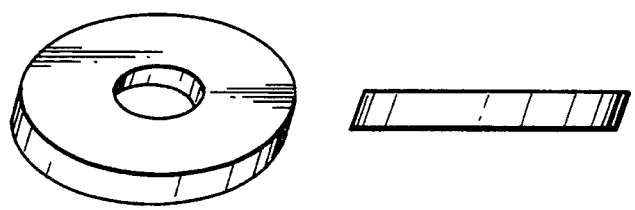
FIG. 8 is a perspective view and a side elevational view showing displacement of the sliding vibrator in FIG. 7 in the polarizing direction.

When voltage is applied to both end faces of the sliding vibrator, since an electric field direction is perpendicular to the polarizing direction, the end faces are deformed as shown in FIG. 8, and sliding is generated in the end faces.

Figure 9:
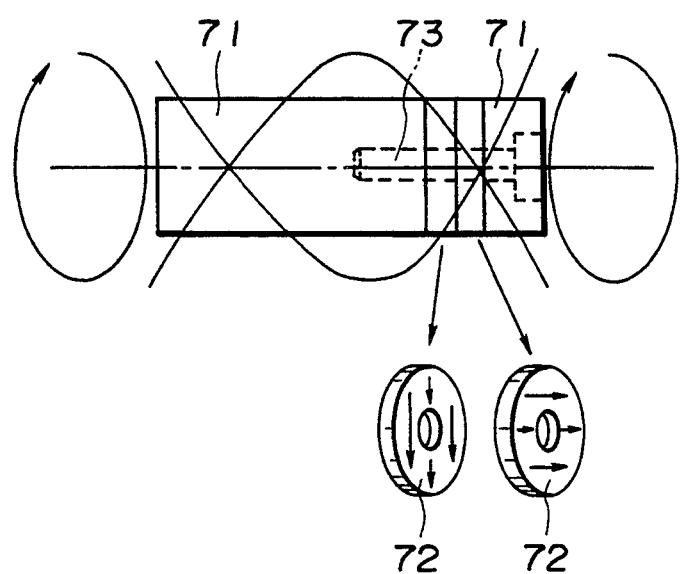
FIG. 9 is an enlarged view of a principal portion of an ultrasonic motor, showing the ultrasonic vibrator which is used in the ultrasonic motor of the aforesaid embodiment.

FIG. 9 is a schematic view of the ultrasonic vibrator according to the present embodiment, which uses the above-described sliding vibrator. As shown in FIG. 9, a pair of sliding vibrators 72 are arranged such that their polarizing directions are shifted 90° from each other. The sliding vibrators 72 are arranged between resonators 71 each of which is made of metallic material, for example. Further, the sliding vibrators 72 are forcedly bonded or crimped and are fixed by a fastening element 73 which is formed by, for example, a bolt or the like and which is arranged at a central axis represented by a dot-dash centerline.

When voltage of sine wave in which phases shift 90° from each other is applied to the pair of sliding vibrators 72, there can be provided an ultrasonic vibrator in which bending vibration rotated about a central axis.

Since a single sliding vibrator has no portion which is reversed in a direction of displacement, there is no generation of cracking at a boundary line, which is a problem in the conventional arrangement. Thus, the single sliding vibrator is stable in characteristic. Further, since a portion of the boundary line of the conventional piezoelectric element cannot be treated or processed in polarizing. portions which are not still used are generated on the piezoelectric element. However, the sliding vibrator according to the present embodiment, which has no boundary line, can be polarized over the entire surface. There are no waste portions. Thus. the sliding vibrator is high in efficiency. Moreover, since the polarizing directions are sufficient only by one direction, manufacturing time can be shortened. The sliding vibrator is very low in cost.

In connection with the above, consideration is made to a piezoelectric constant (m/V) which is a distortion rate or factor generated at the time an electric field of a unit is given under a condition that stress is zero. Generally, even if an electric-mechanical coupling coefficient which expresses a conversion capacity of an energy is equivalent, a piezoelectric constant d15 in the slide direction is larger than a piezoelectric constant d33 in a longitudinal direction. Thus, a relatively large vibration amplitude is easy to be produced from the ultrasonic vibrator. Accordingly, an output from the motor is improved, and there can be produced high torque.

An ultrasonic motor according to the first embodiment, to which the aforementioned ultrasonic vibrator is applied, will next be described.

Figure 2:
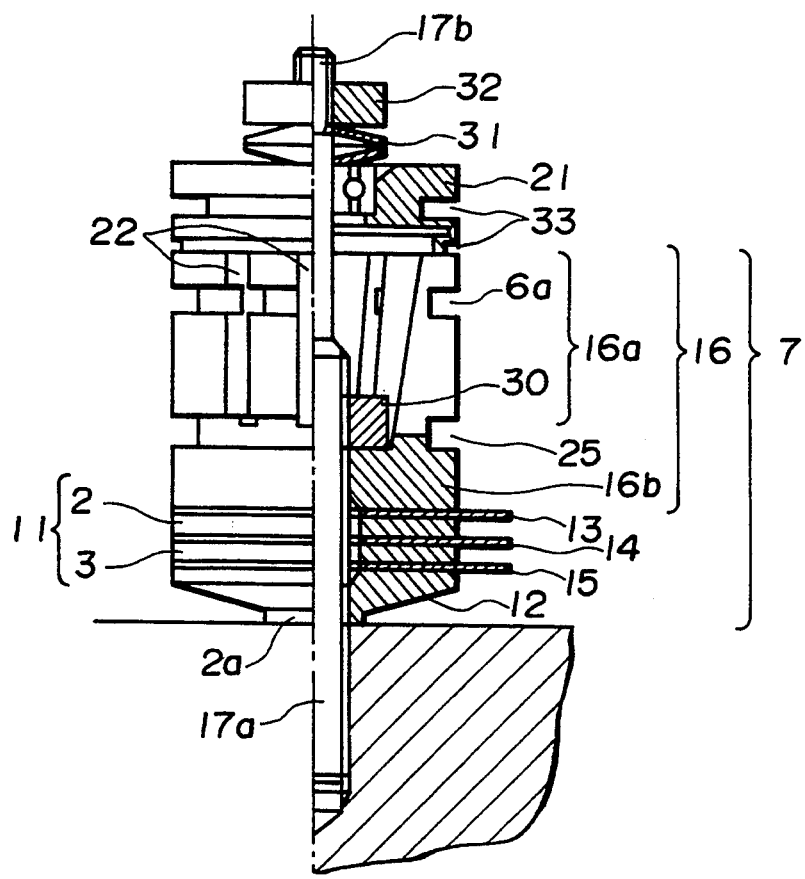
FIG. 2 is a cross-sectional view of the ultrasonic motor according to the first embodiment.

FIG. 1 is an exploded perspective view showing an arrangement of the ultrasonic motor according to the first embodiment of the invention, while FIG. 2 is a cross-sectional view of the ultrasonic motor. In this connection, a piezoelectric element in which silver vacuum deposition is applied to a voltage applying surface is used as an electro-mechanical energy conversion element in the present embodiment.

As shown in FIGS. 1 and 2, the ultrasonic motor comprises, as a principal portion thereof, a first piezoelectric element 2 and a second piezoelectric element 3 which are arranged respectively between three electrode plates 13, 14 and 15, a first resonator 16 and a second resonator 12 which are arranged such that the first and second piezoelectric elements 2 and 3 are placed between end faces of the first and second piezoelectric elements 2 and 3, an ultrasonic vibrator 7 provided with a fastening element 17 by which these constitutional elements are fastened together axially, and a rotor 21 which is forcibly bonded or crimped against one end surface (upper end surface) of the ultrasonic vibrator 7 and which is an element to be rotatably driven in a predetermined direction by ultrasonic vibration of the ultrasonic vibrator 7.

The first and second piezoelectric elements 2 and 3 are sliding vibrators which present a disc configuration having a hollow circular portion, and are polarized in a direction indicated by arrows in FIG. 1 so as to be perpendicular to the axial direction of the ultrasonic vibrator 7. The first piezoelectric element 2 and the second piezoelectric element 3 are arranged in a laminated or stacking direction such that Their polarizing directions are shifted 90° from each other.

The electrode plates 13, 14 and 15 are copper electrode plates for application of voltage, having respective diameters thereof which are substantially the same in type as those of the first and second piezoelectric elements 2 and 3. Terminals A, G and B for soldering lead wires are provided as projections respectively on the electrode plates 13, 14 and 15, and are connected to power sources (not shown), respectively.

Further, the first and second piezoelectric elements 2 and 3, the electrode plates 13, 14 and 15 and the second resonator 12 cooperate with each other to form a vibrator 11.

The first resonator 16 has hollow cylindrical configuration having a bottom 16b, and is made of material superior in vibration transferring, for example, an aluminum alloy, stainless steel, phosphor bronze, duralmin, or a titanium alloy. In the present embodiment, the first resonator 16 uses material in which SUS440C is heat treated, and hardness is equal to or higher than Hv 800. Moreover, in the present embodiment, the first resonator 16 is made such that an oxalic-acid alumite coating is applied to an aluminum alloy, and minute bores in the alumite are filled with hydrate by steam sealing up to the bottoms thereof.

The first resonator 16 has the bottom 16b thereof whose central portion is provided with a threaded portion 18 which is threadedly engaged with a threaded portion screw-threaded with the fastening element 17. The threaded portion 18 is threadedly engaged with the fastening element 17. Furthermore, an interior of the first resonator 16 above the bottom 16b is formed into a hollow portion 20 in the form of cup configuration which is formed with an opening at an upper end face, so that vibration at the upper end face of the first resonator 16 is not restricted by the fastening element 17. Further, a plurality of vertical grooves 22 are formed in an outer peripheral side surface of an upper portion 16a of the first resonator 16 in parallel with a central axis. Thus, the upper portion 16a of the resonator is divided equally into eight (8) parts in a vertical direction to form eight (8) displacement enlarging vibration pieces 6. Moreover, a peripheral groove 25 extending toward a central direction is formed in the outer peripheral side surface between the upper portion 16a and the bottom 16b of the resonator. Furthermore, grooves 6a extending inwardly toward the central direction are formed respectively at positions of the displacement enlarging mechanisms or displacement enlarging vibration pieces 6, which form a node of the bending vibration of the ultrasonic vibrator 7.

The second resonator 12 having a contact surface substantially the same in size and the same in type as the piezoelectric elements 2 and 3 is arranged at lower portions of the respective first and second piezoelectric elements 2 and 3 so that the electrode plates 13, 14 and 15 and the first and second piezoelectric elements 2 and 3 are put between the second resonator 12 and the first resonator 16. The second resonator 12 is formed of a material equivalent to that of the first resonator 16.

The second resonator 12 has a lower portion thereof which presents a substantially conical configuration in which a taper 28 is formed downwardly, and is formed with a projection 29 about a substantially conical central axis so that a contact surface between the projection 29 and an outer fixing portion (not shown) is reduced.

In connection with the above, a location between the electrode plate 13 and the first resonator 16, and a location between the electrode plate 15 and the second resonator 12 are electrically isolated by electric isolation processing.

The ultrasonic vibrator 7 is arranged as follows. That is, the first and second piezoelectric elements 2 and 3, the electrode plates 13, 14 and 15 and the first and second resonators 16 and 12 are laminated upon each other as shown in FIG. 1. The fastening element 17 passes through centers of the respective first and second piezoelectric elements 2 and 3, electrode plates 13, 14 and 15 and first and second resonators 16 and 12. Epoxy adhesive is applied to locations between the constitutional elements. Thereafter, the constitutional elements are crimped together by a crimp nut 30 arranged on the fastening element 17 and the second resonator 12. The adhesive is hardened.

Meanwhile, the fastening element 17 is formed with a bolt further below the second resonator 12. The fastening element 17 crimps the ultrasonic vibrator 7 at a location above the second resonator 12, and supports the rotor 21. The fastening element 17 crimps and supports a lower end face of the ultrasonic vibrator 7 against a fixing element (not shown) below the second resonator 12, to fix the ultrasonic motor.

At an upper end face of the first resonator 16, that is, at the upper end face of the ultrasonic vibrator 7, the rotor 21 which is rotated in a predetermined direction by ultrasonic vibration of the ultrasonic vibrator 7 is so arranged as to be rotatably mounted to the fastening element 17 through a plurality of bearings 26. Further, a variable urging mechanism comprising a belleville spring 31 and a nut 32 which are mounted on the fastening element 17 is arranged on the side of the rotor 21 opposite to a contact surface between the rotor 21 and the ultrasonic vibrator 7 so that a crimping force of the rotor 21 is variable. Furthermore, a pair of thin-walled spring flange portions 33 are formed respectively at two locations in the vicinity of a contact portion between the rotor 21 and the ultrasonic vibrator 7. Thus, frequency of vibration of the natural mode of the contact portion of the rotor 21 is higher than the driving frequency of the ultrasonic vibrator 7.

The ultrasonic motor arranged in this manner applies sine wave voltage in the vicinity of a resonance frequency to the pair of terminals A and B of the respective electrode plates 13 and 15 with 90° shifting in time (sin ωt, cos ωt), and the terminal G of the electrode plate 14 is grounded, whereby such a motion that bending vibration of a primary mode is rotated about a central axis of the ultrasonic vibrator 7 is generated on the ultrasonic vibrator 7. Thus, the rotor 21 is rotated in a predetermined direction.

Next, operation of the present embodiment arranged as described above will be described.

When the sine wave voltage in the vicinity of the resonance frequency in which phases are shifted 90° from each other is applied to the first and second piezoelectric elements 2 and 3, bending vibration which is rotated about the central axis is generated on the ultrasonic vibrator 7. Accordingly, elliptic motion which is rotated about the central axis is generated on the end face of the ultrasonic vibrator 7. The rotor 21 which is urged and arranged by the urging means is rotated. Further, when phase differences of the driving voltage are shifted 180° from each other the elliptic motion in reverse rotation is generated on the ultrasonic vibrator 7 so that the rotor 21 is rotated in the reverse direction.

In the present embodiment, since the piezoelectric elements 2 and 3 which vibrate in the slide direction polarized in one direction are used as the electric-mechanical energy conversion element, there can be provided a piezoelectric constant which is higher than a piezoelectric element vibrated in a thickness direction. Thus, it is possible to generate bending vibration having large amplitude. Moreover, since there are no boundary lines in which a displacement direction is inverted, within the piezoelectric elements 2 and 3, generation of cracks due to stress is non-existent, and it is possible to use the entire electric-mechanical energy conversion element. Thus, the electric-mechanical energy conversion element becomes an piezoelectric element in which there is less waste.

Accordingly, in the present embodiments, since the piezoelectric elements which excite the bending vibration are brought to a sliding vibrator, there can be provided high torque due to large vibration amplitude. Further, no cracks or the like are generated in the piezoelectric elements, and it is possible to maintain the motor output stable. Since it is possible to manufacture the piezoelectric elements at low cost, an attempt can be made to reduce cost.

Figure 3:
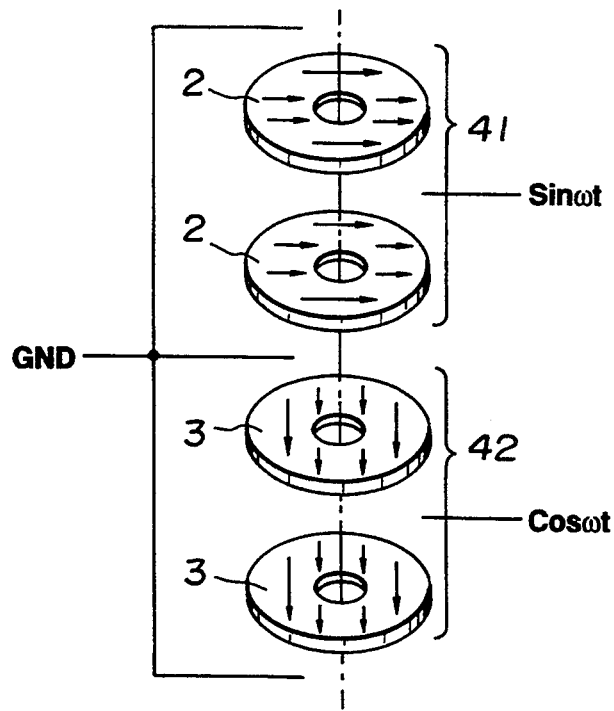
FIG. 3 is an exploded perspective view of a principal portion of the motor of FIG. 1, showing an arrangement of a piezoelectric element for driving in a second embodiment of the invention.

FIG. 3 is an exploded perspective view of a principal portion of the ultrasonic motor, showing an arrangement of a pair of piezoelectric elements in an ultrasonic motor according to a second embodiment of the invention.

The second embodiment is an embodiment in which each of the first and second piezoelectric elements 2 and 3 in the first embodiment is provided in pairs respectively, and four in total. The remaining arrangement is similar to that of the first embodiment, and the description of the same or identical parts and elements will be omitted. Further, FIG. 3 shows only an arrangement of the piezoelectric elements, and the other constitutional elements such as electrode plates and the like are omitted.

The second embodiment uses a sliding vibrator similar to that of the first embodiment, as an electro-mechanical energy conversion element. That is, a group of first piezoelectric elements 41 and a group of second piezoelectric elements 42 are arranged such that polarizing directions (indicated by arrows in FIG. 3) shift 90° from each other. Each pair of piezoelectric elements 2 and 3 in each of the groups of piezoelectric elements are arranged such that polarizing directions are the same direction. Moreover, sine wave voltage (sin ωt, cos ωt) in which phases are shifted 90° is applied by a driving circuit (not shown) as illustrated in FIG. 3.

According to the present embodiment, it is possible to produce bending vibration having larger amplitude by an increase in the sliding vibrator. Since end faces of the piezoelectric elements in the respective groups of piezoelectric elements become GND, it is not required to apply electric insulation processing to contact surfaces between the electrode plate 13 (refer to FIG. 1) of the first resonator 16 (refer to FIG. 1) and the end faces of the piezoelectric elements, and it is also not required to form the fastening element 17 by ceramics or the like. Accordingly, high torque is realized by the large vibration amplitude. Furthermore, it is possible to use a fastening element of low cost. Moreover, an attempt can be made to reduce cost by omission of the electric insulating processing or the like.

Figure 4:
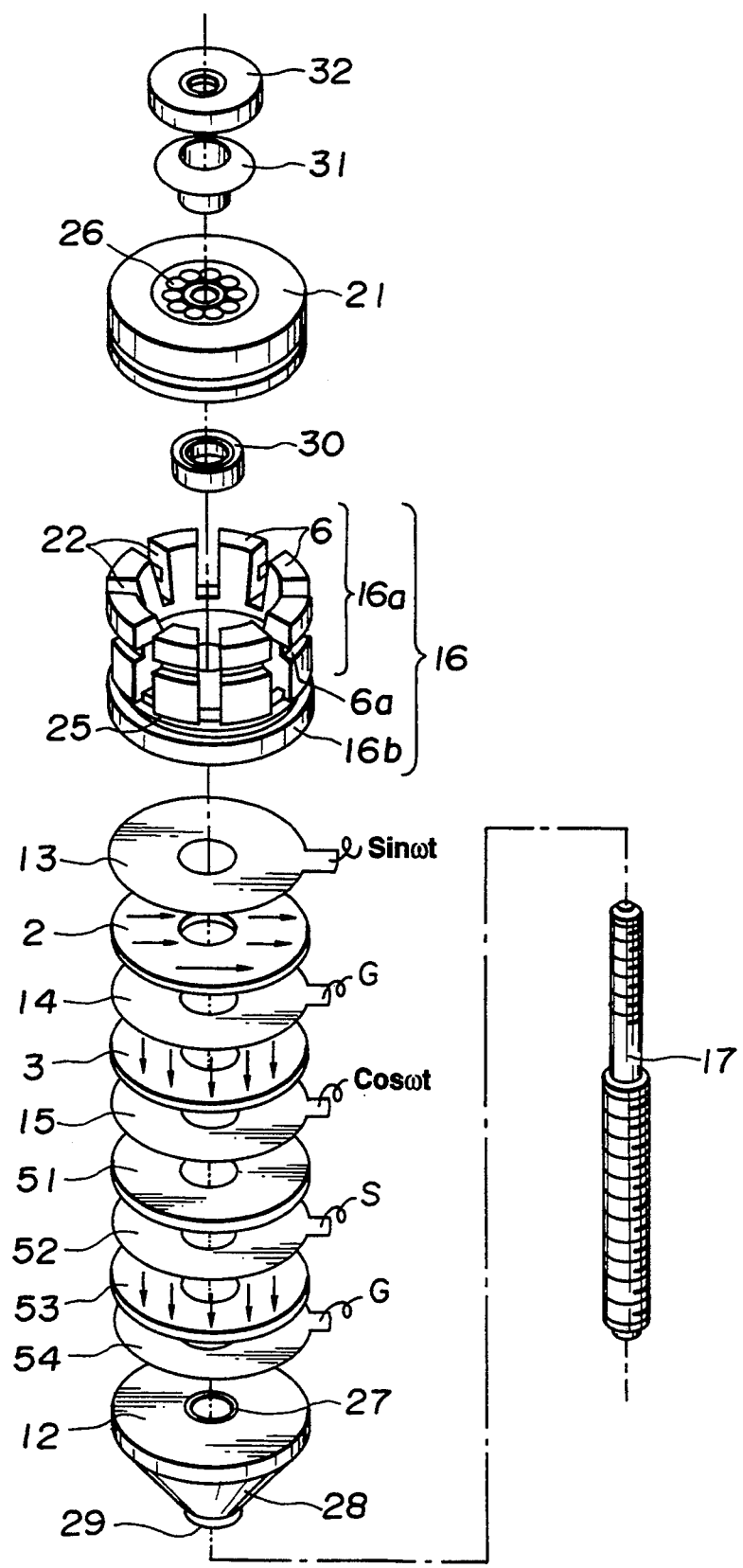
FIG. 4 is an exploded perspective view showing an arrangement of an ultrasonic motor according to a third embodiment of the invention.

FIG. 4 is an exploded perspective view showing an arrangement of an ultrasonic motor according to a third embodiment of the invention.

The third embodiment principally has the arrangement similar to that of the first embodiment, and is arranged such that a piezoelectric element for detection of vibration is added to the first embodiment.

An electric insulating element 51, a sliding vibrator 53 for detection, and a pair of electrode plates 52 and 54 are arranged between an electrode plate 15 and a second resonator 12, as shown in FIG. 4.

For the electric insulating element ceramics, material in which alumite processing is applied to an aluminum alloy, or the like is adequate in order not to alienate or avoid vibration transfer. In the present embodiment, alumina ceramics is used as the electric insulating element 51.

Polarization processing is applied to the sliding vibrator 53 for detection, similar to the first and second piezoelectric elements 2 and 3 which are sliding vibrators for driving. The sliding vibrator 53 for detection is so arranged as to be in agreement with the polarizing direction of either one of the first piezoelectric element 2 and the second piezoelectric element 3. In the present embodiment, the sliding vibrator 53 is arranged in agreement with the polarizing direction of the second piezoelectric element 3.

The electrode plate 52 outputs a signal S for detection of vibration, while the electrode plate 54 is connected to GND.

Figure 5:
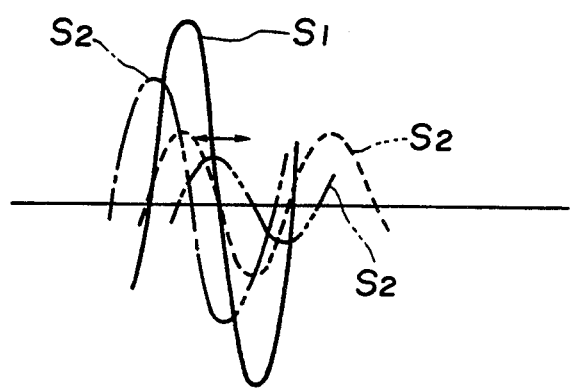
FIG. 5 is a diagram showing a detecting example of a vibration detecting signal from an electrode plate for detection in the third embodiment.

FIG. 5 is a diagram showing a detecting example of the output S from the electrode plate 52, that is, a vibration detecting signal.

Also in the arrangement like the present embodiment, a voltage value of a detecting signal S2 is maximized in the vicinity of the resonance frequency and there can be produced the constant relationship between a driving voltage S1 and the phase difference. In this connection, since the sliding vibrator is large in piezoelectric constant, it is possible to detect the vibration sharper than a vibrator polarized in a thickness direction.

By the fact that the piezoelectric element 53 for detection of the vibration is brought also to a sliding vibrator, an attempt can be made to reduce the cost. Thus, sharp detection of the vibration is made possible.

Figure 6:
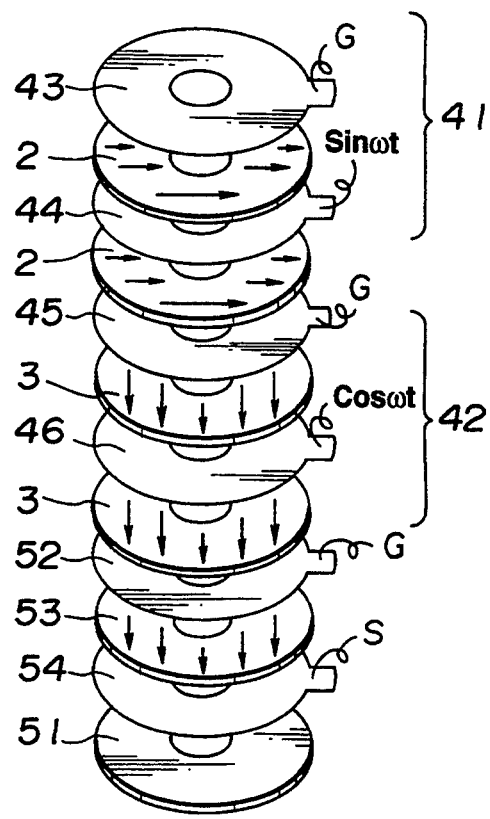
FIG. 6 is an exploded perspective view of a principal portion of an ultrasonic motor, showing a modification of a piezoelectric element for driving in the third embodiment.

FIG. 6 is an exploded perspective view of a principal portion of an ultrasonic motor, showing a modification of the group of piezoelectric elements for driving in accordance with the third embodiment.

The modification is arranged such that the piezoelectric elements for driving in the third embodiment are formed by four (4) elements, similar to the second embodiment. That is, the electrode plate 54 and the sliding vibrator 53 for detection of vibration are arranged on an end face of one of first and second (i.e. pairs) of piezoelectric elements 41 and 42 for driving. Also in this case, the polarizing direction of the sliding vibrator 53 for detection of vibration is in agreement with the first group of piezoelectric elements 41 or the second group of piezoelectric elements 42. In this connection, in FIG. 6, the reference numerals 43, 44, 45 and 46 denote electrode plates similar to those in the first embodiment. Voltage is applied to these electrode plates 43, 44, 45 and 46 as shown in FIG. 6.

Figure 10:
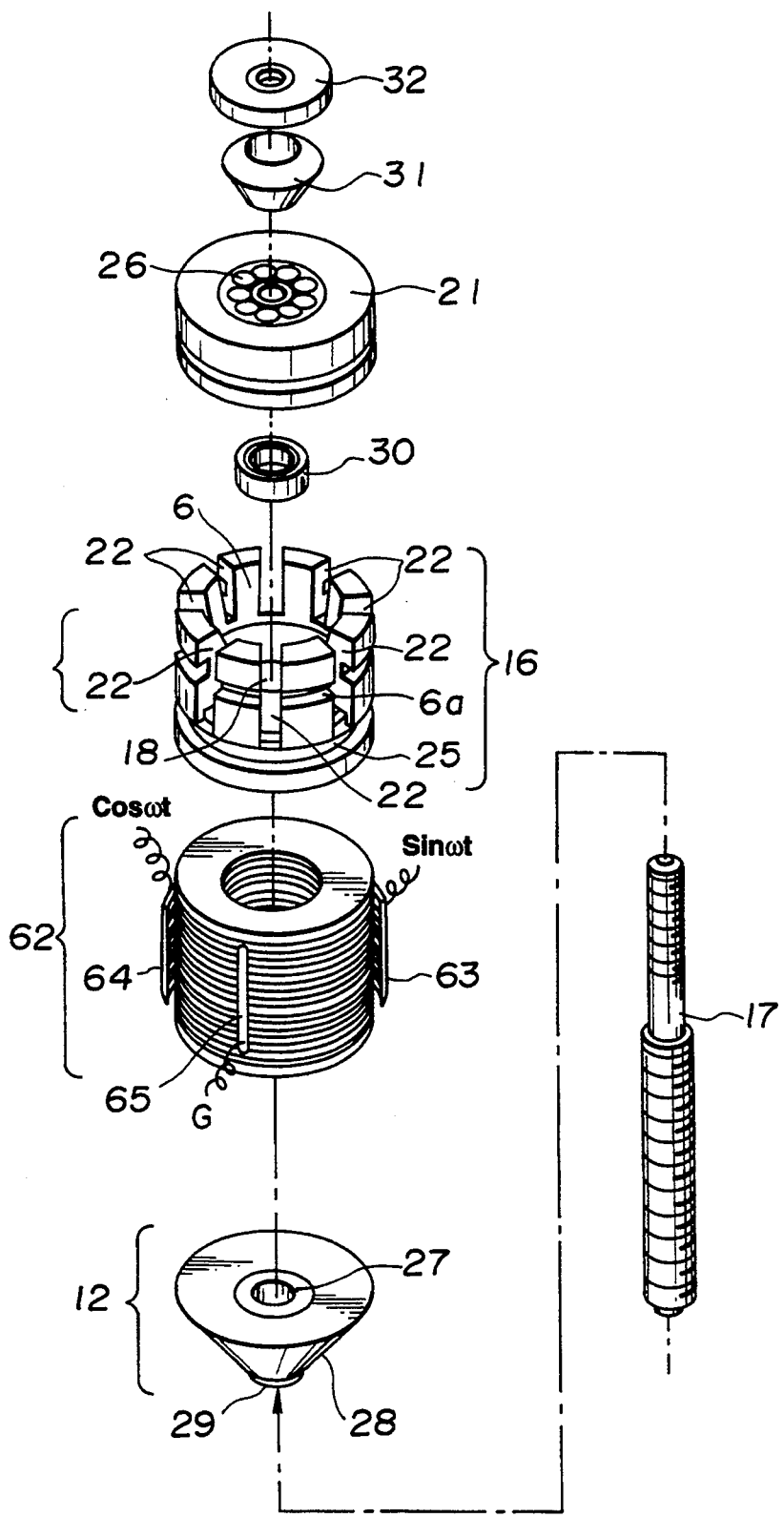
FIG. 10 is an exploded perspective view showing an arrangement of an ultrasonic motor according to a fourth embodiment of the invention.
Figure 11:
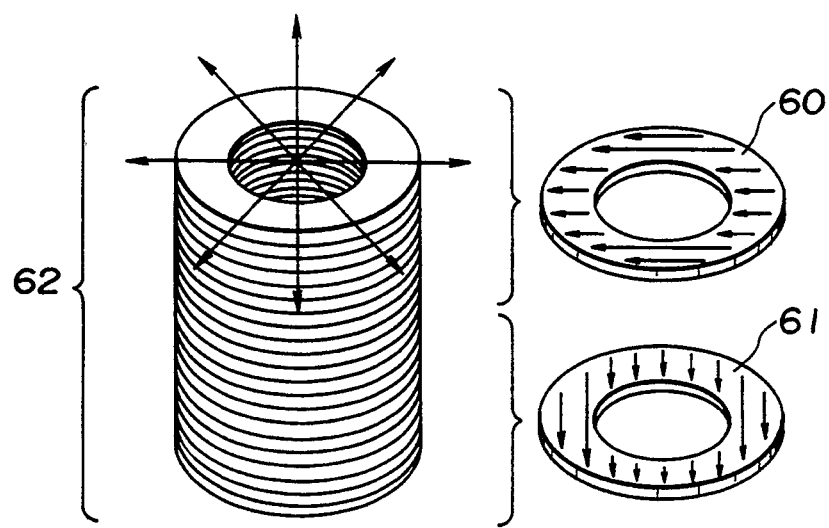
FIG. 11 is a perspective view of a bending piezoelectric actuator which is arranged such that a plurality of sliding vibrators used in the above-described embodiment are arranged in laminated or stacking relation to each other.
Figure 12:
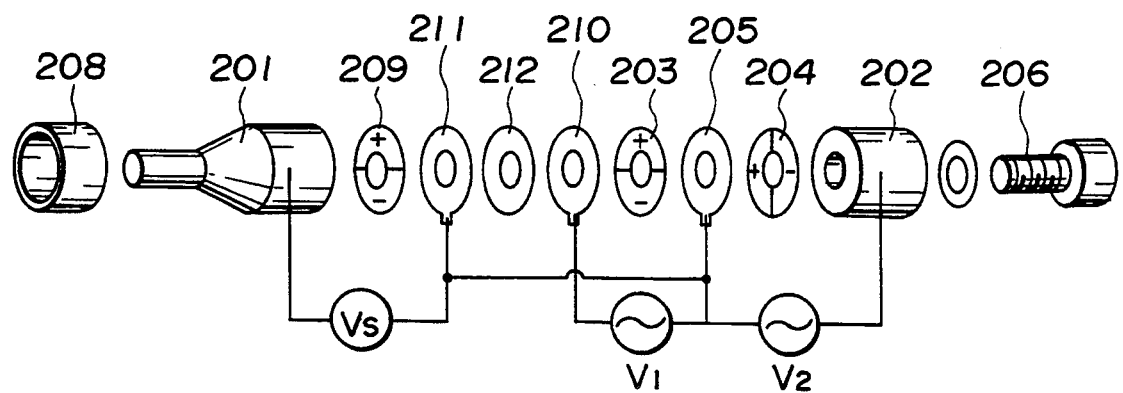
FIG. 12 is an exploded perspective view showing an example of a conventional ultrasonic vibrator.

FIG. 10 is an exploded perspective view showing an arrangement of an ultrasonic motor according to a fourth embodiment of the invention. FIG. 11 is a perspective view of a bending piezoelectric actuator in which a plurality of sliding vibrators are arranged in stacking or lamination.

The fourth embodiment is principally arranged similar to the first embodiment, and is arranged such that a plurality of thin-plate or thin-sheet piezoelectric elements (sliding vibrators) are arranged in place of the first and second piezoelectric elements in the first embodiment.

As shown in FIG. 11, a plurality of thin-sheet first piezoelectric elements (sliding vibrators) 60 and a plurality of second piezoelectric elements (sliding vibrators) 61 are laminated or stacked upon each other in such a direction that polarizing directions thereof are shifted 90° respectively. Thin-sheet electrode plates are arranged between the piezoelectric elements 60 and 61. Epoxy adhesive is applied to a location between the piezoelectric elements 60 and 61 and, thereafter, the piezoelectric elements 60 and 61 are crimped together, to form a bending piezoelectric actuator 62. In FIG. 11, the arrangement is such that polarizing directions shift 90° from each other in an upper portion and a lower portion from a center of the actuator 62.

The above-described bending piezoelectric actuator 62 is so arranged as be put between a first resonator 16 and a second resonator 12 as shown in FIG. 10 to form an ultrasonic vibrator 7.

Positive electrode plates 63 of an upper actuator section in the bending piezoelectric actuator 62, positive electrode plates 64 of a lower actuator section and a common negative electrode plate 65 of the upper and lower actuator sections are lined up on a side surface of the actuator 62 as shown in FIG. 10 to arrange projections of the respective electrode plates. The projections are connected.

Sine wave voltages (sin ωt, cos ωt) in the vicinity of the resonance frequency in which phases are shifted 90° from each other are applied to the positive electrode plates 63 and 64 from a driving circuit (not shown). The negative electrode plate 65 is connected to GND.

In the present embodiment, since the plurality of sliding vibrators are laminated or stacked upon each other, there can be produced extremely large bending vibration amplitude. Thus, it is possible to rotate the rotor urged and arranged, with high torque.

As described above, according to the present invention, it is possible to reduce the cost of the piezoelectric elements, and to provide the small-size ultrasonic motor which is low in cost, and which can produce a stable characteristic of high efficiency.

In this invention, it is apparent that working modes different in a wide range can be formed on the basis of this invention without departing from the spirit and scope of the invention. This invention is not restricted by any specific embodiment except as limited by the appended claims.

What is claimed is:

1. An ultrasonic motor comprising:
   an ultrasonic vibrator having a pair of resonators for transferring and enlarging ultrasonic vibration, electro-mechanical energy conversion means arranged between the pair of resonators, for generating ultrasonic vibration by application of an alternating voltage, and fastening means for crimping and fixing the pair of resonators and the electro-mechanical energy conversion means to each other; and
   an element to be driven being crimped to an end of at least one of the resonators and driven by elliptic vibration which is generated at said end,
   wherein the electro-mechanical energy conversion means comprises first and second sliding vibrators which are polarized respectively in first and second directions which are perpendicular to an axial direction and which are shifted 90° from each other.

2. An ultrasonic motor according to claim 1, wherein vibration generated by said ultrasonic vibrator comprised of said pair of sliding vibrators is detected by a third sliding vibrator which is arranged between said resonators.

3. An ultrasonic motor according to claim 1, wherein said electro-mechanical energy conversion means comprises a plurality of sliding vibrators arranged in groups, the sliding elements in each group being polarized respectively in directions which are perpendicular with respect to the axial direction and which are shifted 90° from each other.

4. An ultrasonic motor according to claim 1 wherein said sliding vibrators are disc-shaped members provided with central openings for receiving said fastening means and having a pair of major surfaces opposing one another; and
   the direction of said polarization being substantially parallel to said major faces.

5. An ultrasonic motor according to claim 4 further comprising a plurality of disc-shaped electrodes interspersed among said sliding vibrators for coupling electrical energy thereto.

6. An ultrasonic motor according to claim 5 comprising detector means for detecting ultrasonic vibration, said detector means comprising a third sliding vibrator arranged between said resonators for generating an electric signal representing detected vibration.

7. An ultrasonic motor according to claim 6 wherein said third sliding vibrator employed for detection is substantially similar in design and function to the sliding vibrators provided for producing ultrasonic vibration.

8. An ultrasonic motor comprising:
   an ultrasonic vibrator having a pair of resonators for transferring and enlarging ultrasonic vibration, electro-mechanical energy conversion means arranged between the pair of resonators, for generating ultrasonic vibration by application of an alternating voltage, and fastening means for crimping and fixing the pair of resonators and the electro-mechanical energy conversion means to each other; and
   an element to be driven being crimped to an end of at least one of the resonators and driven by elliptic vibration which is generated at said end,
   wherein the electro-mechanical energy conversion means comprises first and second groups of sliding vibrators which are polarized respectively in first and second directions which are perpendicular to an axial direction and which are shifted 90° from each other.

9. An ultrasonic motor according to claim 8 wherein said sliding vibrators are disc-shaped members having major faces on opposite sides thereof;
   the direction of polarization being parallel to said major faces;
   all of the sliding vibrators in said first group having their polarization directions in parallel.

10. An ultrasonic motor comprising:
    an ultrasonic vibrator having at least one resonator for transferring and enlarging ultrasonic vibration, electro-mechanical energy conversion means arranged between said at least one resonator, for generating ultrasonic vibration by application of an alternating voltage, and fastening means for crimping and fixing said at least one resonator and the electro-mechanical energy conversion means to each other; and an element to be driven being crimped to an end of said at least one resonator and driven by elliptic vibration which is generated at said end, wherein the electro-mechanical energy conversion means comprises first and second sliding vibrators which are polarized respectively in first and second directions which are perpendicular to an axial direction and which are shifted 90° from each other.

* * * * *